United States Patent

Janssen et al.

[11] Patent Number: 6,099,324
[45] Date of Patent: Aug. 8, 2000

[54] ELECTRICAL MOTOR UNIT HAVING A CONTROL MODULE

[75] Inventors: Josephus Antonius Maria Janssen, Tilburg; Lucas Soes, Rosmalen; Johannes Lambertus Van De Sandt, Drongelen, all of Netherlands

[73] Assignee: The Whitaker Corporation, Wilmington, Del.

[21] Appl. No.: 09/116,459

[22] Filed: Jul. 16, 1998

[30] Foreign Application Priority Data

Jul. 21, 1997 [GB] United Kingdom .................... 9715338

[51] Int. Cl.⁷ ...................................... H01R 9/09
[52] U.S. Cl. ........................................... 439/76.1; 361/785
[58] Field of Search ................................ 439/76.1, 736, 439/399, 441; 361/785, 421, 813

[56] References Cited

U.S. PATENT DOCUMENTS

| 3,810,300 | 5/1974 | Hulmes et al. ............................ 29/574 |
| 4,142,287 | 3/1979 | Grabbe ...................................... 29/628 |
| 4,303,297 | 12/1981 | Smart et al. ....................... 339/218 M |
| 4,600,471 | 7/1986 | Rose et al. .............................. 361/421 |
| 4,611,262 | 9/1986 | Galloway et al. ...................... 361/421 |
| 4,673,837 | 6/1987 | Gingerich et al. ..................... 439/399 |
| 4,766,520 | 8/1988 | Huber et al. ........................... 361/421 |
| 4,783,906 | 11/1988 | Gingerich et al. ....................... 29/827 |
| 4,821,413 | 4/1989 | Schmitt et al. ........................... 29/883 |
| 4,895,536 | 1/1990 | Gingerich et al. ...................... 439/885 |
| 4,965,933 | 10/1990 | Mraz et al. .............................. 29/882 |
| 5,267,379 | 12/1993 | Pak ......................................... 29/25.35 |
| 5,446,626 | 8/1995 | Dittmann et al. ....................... 361/785 |
| 5,599,201 | 2/1997 | Sommer et al. ........................ 439/441 |

FOREIGN PATENT DOCUMENTS

| 0 639 884 A1 | 2/1995 | European Pat. Off. ....... H02K 11/00 |
| 42 18 793-A1 | 12/1993 | Germany ......................... H05K 7/10 |
| 2 308 015 | 6/1997 | United Kingdom ............ H05K 3/34 |
| WO9607302-A1 | 3/1996 | WIPO ............................. H05K 3/20 |

OTHER PUBLICATIONS

J.W. Specks, P. Schulmeyer, "Mixed–Technology IC's and Mechatronics for Satellite ECU's in Automotive Comfort and Safety Systems", Jun. 1997.

Primary Examiner—Khiem Nguyen
Assistant Examiner—J. F. Duverne

[57] ABSTRACT

An electrical motor unit 2 having main housing 4 with the inner workings of the motor, a brush housing 44 at one end of the main housing 4, and a control module disposed along the main housing 4 generally transverse to the brush housing 44; where the control module includes circuit links 26 defining a circuit grid 24 with electronic components 30 thereupon to define a control circuit where some of the circuit links 30 include first contacts 32 for mating with an electrical connector and second contacts 34 that are pluggably matable with electrical circuitry of the brush housing 44 as the circuit grid 24 is fitted to the rain housing 4.

12 Claims, 4 Drawing Sheets

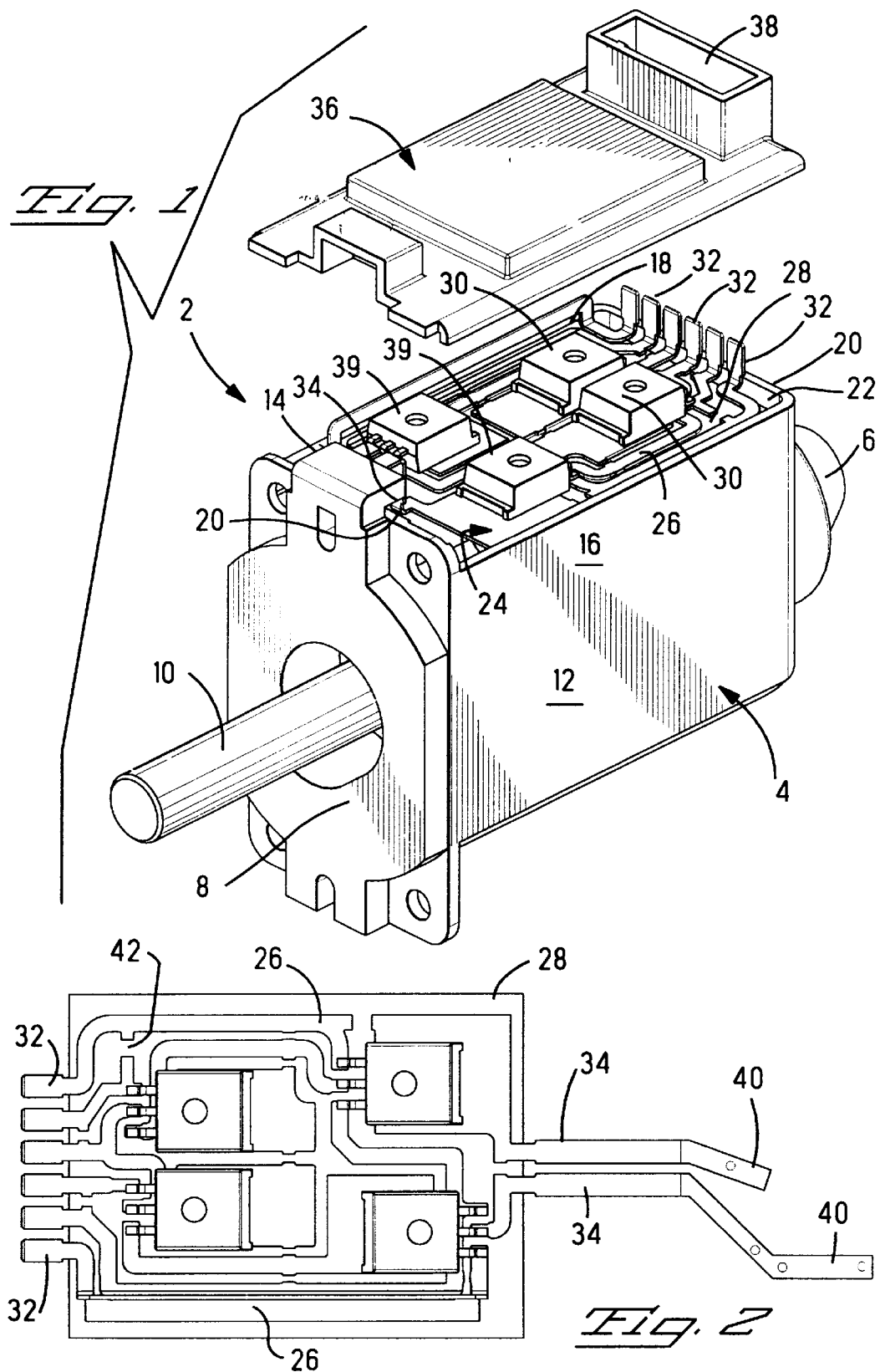

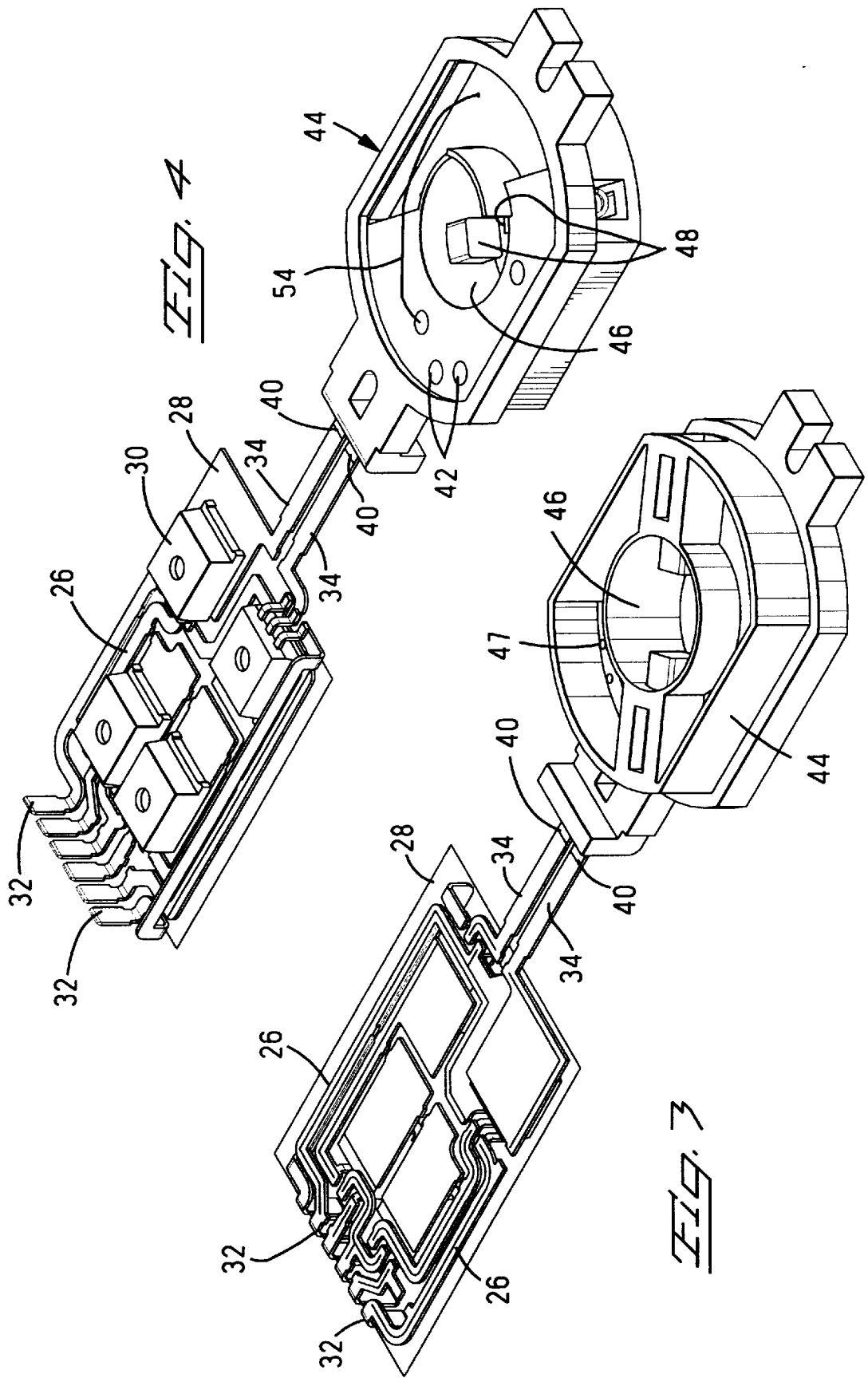

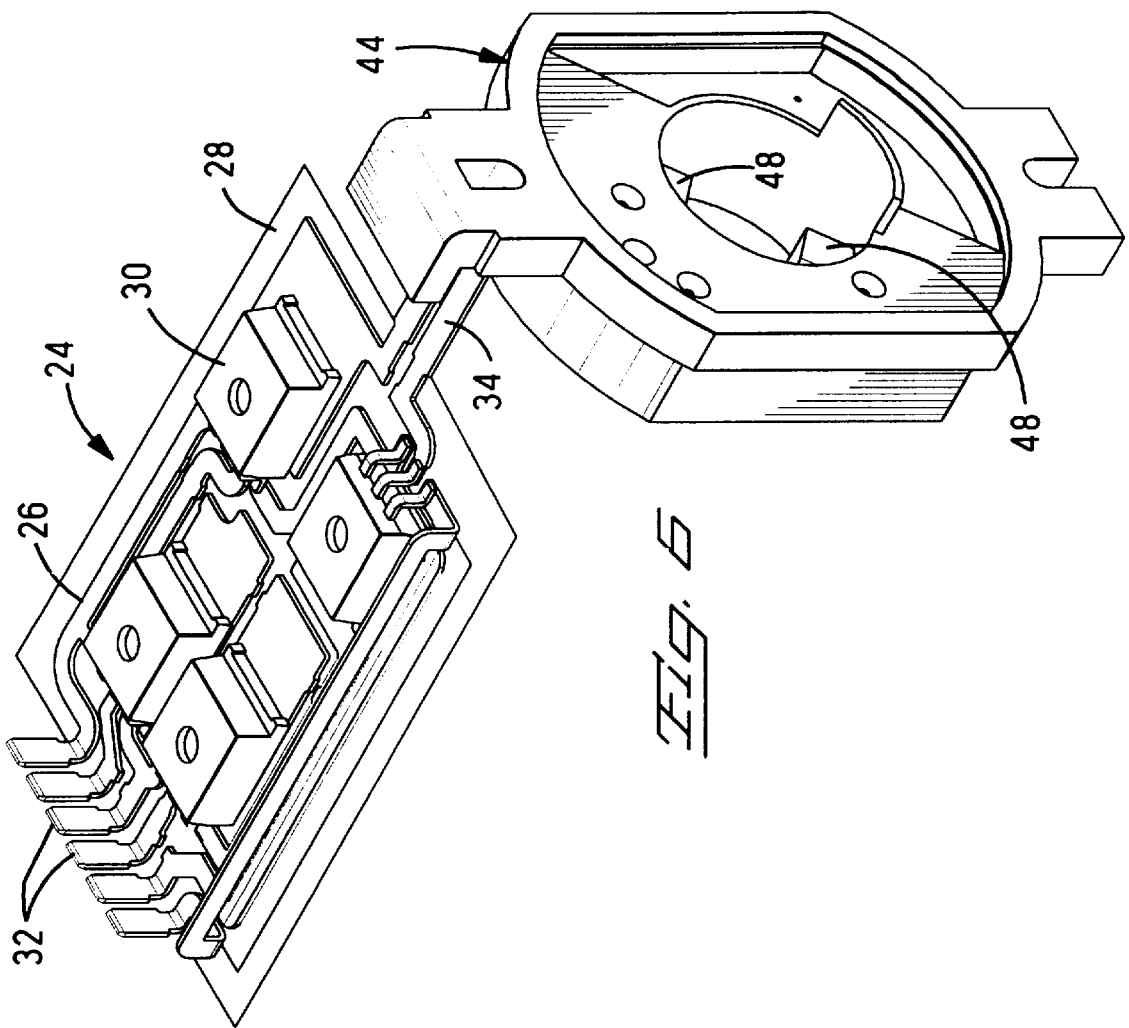
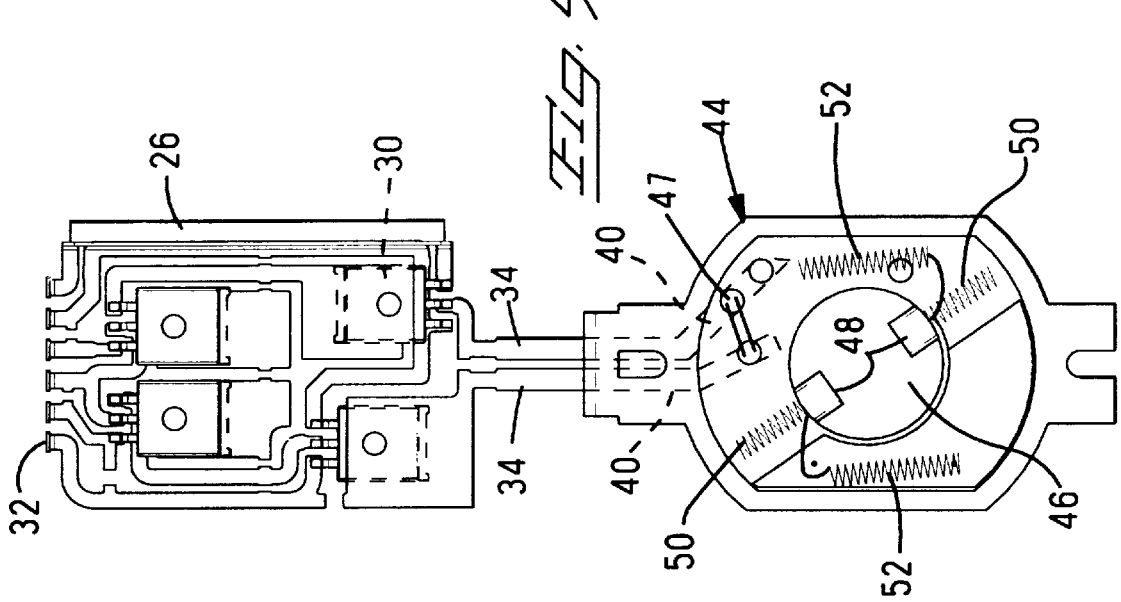

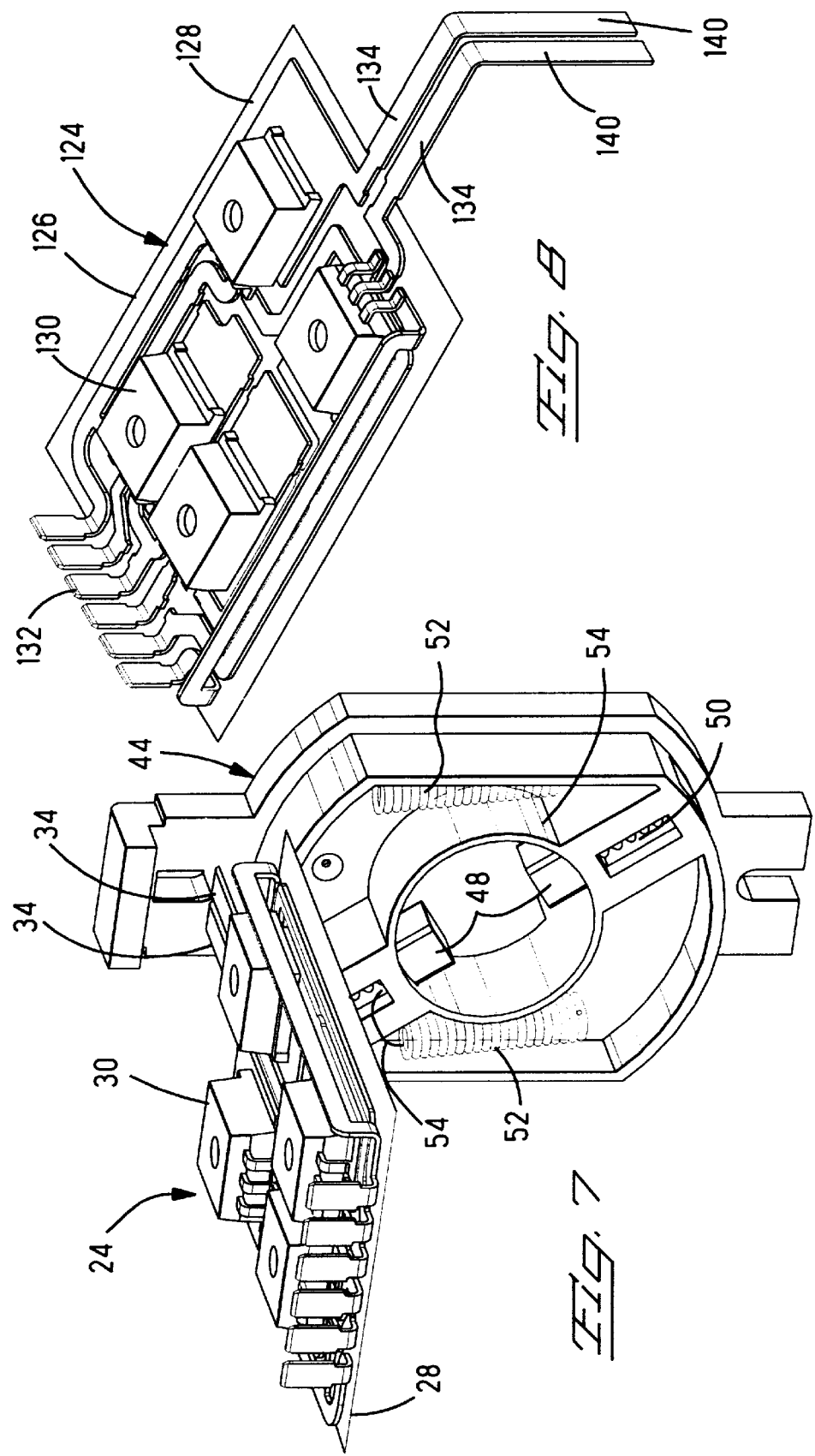

ELECTRICAL MOTOR UNIT HAVING A CONTROL MODULE

BACKGROUND OF THE INVENTION

1. Field of the Invention

The present invention relates to electrical motors and in particular those motors utilized in control of servo systems in automobiles.

2. Description of the Prior Art

As automobiles are becoming more and more complex, the use of various motors and other electro-mechanical devices is increasing. The use of control or servo motors are being used, for example, in window lift devices, climate control systems, automatic seat adjusters, not to mention a number of direct vehicle functions, such as power steering devices. All of these motors and associated systems require a control device.

Until now, it has been the practice of the industry to utilize a central control unit that provides the "intelligence" to control these systems. These motor management devices are connected with essentially "dumb" devices by wires and connectors. As the number of devices increases and the complexity of the vehicles goes up, the number of connections, and the associated costs, rises dramatically.

In order to address this problem, the automotive industry is investigating the use of multiplexed signal communication systems to control a vehicle's electronic functions. These systems typically would use a bus system of wiring incorporating communication and power/ground lines. A central intelligent device possibly would receive inputs from sensors, the operator and possibly external sources, analyze this data and then send out instructions along the bus line for initiating required activity. In order to make such a structure practical and acceptable for widespread use, it would be very helpful to have inexpensive local management of the electronic devices. This local management would typically include some form of data processing, so that the instructions from the main unit may be processed, monitored and communicated, and local power management devices, so that any instructions/adjustments can be carried out.

One existing concept to accomplish these goals reliably in a vehicle is to provide these electronic devices control circuitry upon known stamped and formed circuit grids. The stamped and formed circuit grids have an advantage over printed circuit boards in that the circuit links therein can handle the current/power necessary to operate the electronic devices referred to above. The technology to produce units such as this is shown in U.S. Pat. Nos. 4,142,287; 4,600,971; 4,675,989 incorporated herein by reference in their entirety and for all purposes. While the aforegoing presently exists, what is needed to make this technology acceptable to automotive manufactures is to provide a complete and low cost package that can be plugged into a system such as that described above.

SUMMARY OF THE INVENTION

The present invention addresses this problem by providing for an electrical motor a stamped and formed circuit unit having circuit links interconnecting electronic devices, such as Integrated Circuits and power transistors, the stamped and formed circuit unit having integrally formed contacts for mating with conductors of a control system and a second set of contacts for connection to brushes within the motor.

In one case, it is envisioned that the second set of contacts would be molded into a housing that would carry the brushes of the motors and be connected therewith. In another case, it is envisioned that the second set of contacts are formed as tabs that are connected to the tabs as a result of mounting the unit to the housing.

BRIEF DESCRIPTION OF THE DRAWINGS

FIG. 1 is an upper side and partially exploded perspective view of a motor unit incorporating the present invention;

FIG. 2 is a plan view of a stamped grid that can be used in the motor of FIG. 1;

FIG. 3 is a bottom side perspective view of the stamped grid of FIG. 2 showing a housing thereupon;

FIG. 4 is a top side perspective view corresponding to FIG. 3 with Integrated Circuit devices affixed to the circuit links of the grid and brush gear incorporated into the housing;

FIG. 5 is a bottom plan view corresponding to FIG. 4;

FIG. 6 is a front side upper perspective view of the assembly of FIGS. 4 and 5 ready to be incorporated into the motor unit of FIG. 1;

FIG. 7 is a rear side perspective view corresponding to FIG. 6; and,

FIG. 8 is an alternative embodiment of the present invention showing a circuit unit that is pluggable into a motor unit to form the unit of FIG. 1.

DETAILED DESCRIPTION OF THE PREFERRED EMBODIMENT

With reference first to FIG. 1, a motor unit according to the present invention is shown generally at 2. This exemplary motor unit 2 is a conventional DC stepper motor, however the present invention should be applicable to any motor unit. The motor unit 2 includes a main body 4 having a rear cap 6 and a forward cover plate 8. A drive shaft 10 extends outward of the forward cover plate 8 and within the main body 4, typically with the motor winding. The inner workings and general structure of a motor of this type are well known and will not be described in detail, except where necessary to illustrate the invention.

The main body 4 includes opposing sidewalls 12,14 that have extended portions 16,18 that together with end walls 20 define a stamped circuitry receiving cavity 22. That portion of the main body 4 that includes the receiving cavity 22 may also be a separate component. One requirement is the ability to act as a heat sink in order to dissipate heat.

A stamped and formed circuit grid assembly 24 having various circuit links 26 is disposed in the receiving cavity and electrically isolated from the main body 4 by insulative tape 28. The insulative tape 28 also supports the circuit links 26 in order to protect the integrity of the assembly 24. An overmold may also be possible as disclosed in the aforegoing patents. Various electronic components 30 are disposed on the links 26 in order to form a circuit. While in this example, the electronic components 30 are packaged, it may also be desirable to integrate raw die components directly to the circuit links 26 through a wire bonding process. The electronic components can be power control devices such as power transistors or logic control devices such as a CPU. The assembly 24 further includes first contacts 32 extending outward for plugging access by a mating connector (not shown) in order to incorporate the motor 2 into the electrical system. A second set of contacts 34 extend into the main body 4 for connection with the motor, as will be more clearly described below.

A cover 36 is provided to fit over the cavity 22 and enclose the stamped circuitry assembly 24. The cover 36 should also have good heat transfer characteristics. An access port 38 is formed therein that would be received about the first contacts 32 to enable the mating connector to be engaged with the contacts 32.

With reference now to FIG. 2, the circuit links 26 are shown upon the insulative tape 28. The second contacts 34 for electrical engagement with the motor unit include extensions 40 as will be described below. The various circuit links 26 are stamped from a single sheet of conductive material and if desired provided with a conductive plating. In order to ease handling, a first stamping would result in all the links 26 still being interconnected such that a one piece frame results. The links 26 are then separated by cutting away web portions, such as a 42.

With reference now to FIG. 3, a brush housing 44 is overmolded upon the extensions 40 of the second contacts 34 of the circuit links 26 of FIG. 3. The brush housing 44 includes a central opening 46 for the drive shaft 10 and a plurality of passageways 47 for electrical interconnections.

With reference now to FIGS. 4 and 5, the integrated circuit devices 30 are attached to circuit links 26 by surface mount soldering techniques. The first contacts 32 have been bent perpendicularly to the plane of the circuit links 26. Additionally, brushes 46 are positioned in the housing 44 such that they extend into the central opening 46. The brushes are biased by spring members 50 and connected to coils 52. The coils 52 are either directly connected to the extensions 40 of the second contacts 34 by way of the passageways 47 or through the use of jumpers 54.

With reference now to FIGS. 6 and 7, the second contacts have been bent through 90 degrees such that the unit is ready to be installed upon the basic motor by, for example, the motor manufacturer. Once the stamped circuit grid assembly has been positioned in the cavity 22, it may be desirable to fill the cavity with a potting compound or gel in order to protect the components from environmental contamination.

With reference now to FIG. 8, an alternative embodiment of the present invention is shown at 124. In this embodiment a similar stamped circuit grid is provided to that described above having similar circuit links 126 disposed on an insulative tape 128 with electronic components 130 affixed thereto. This assembly 124 also includes first and second contacts 132 and 134. However, in this embodiment, the second contacts 134 include extensions 140 formed as tabs and disposed in the insertion direction of the assembly 124 into the cavity 22 of the main housing 4 such that upon insertion, the electrical connection would be established with the brushes 48 therein. This could be accomplished by providing receptacle contacts with the brush gear.

We claim:

1. An electrical motor unit, comprising:
   a main body with a drive shaft therein, the main body including the inner workings of the electrical motor and extending longitudinally in a direction corresponding to that of the drive shaft and having a cap at one end; and, a brush housing opposite the cap and disposed transversely to the main body, the brush housing having a central opening through which the drive shaft extends and a plurality of passageways, at least two passageways extending into the central opening and including brushes therein, and associated circuitry within the brush housing that is electrically connected to the brushes; the electrical motor unit being characterized in that:
   a control module is located along the main body and extends in a direction between the brush housing and the cap, the control module having various circuit links that define a circuit grid and are disposed in a receiving cavity; the circuit links are formed from conductive material with various electronic components disposed upon the at least some of the links to form a circuit, where at least some of the links include first contacts disposed at an access port for mating with an electrical connector to incorporate the electrical motor unit into an electrical system; at least some of the links include second contacts extending from the lines; and the second contacts being connected with the associated circuitry of the brush housing through a transversely extending electrical pathway.

2. The electrical motor unit of claim 1, further characterized in that the second contacts include extensions that are formed as tabs that are pluggably received by the associated circuitry of the brush housing.

3. The electrical motor unit of claim 2, further characterized in that the second contacts incorporate the transversely extending pathway.

4. The electrical motor unit of claim 2, further characterized in that the circuit links are formed from a sheet of conductive material.

5. The electrical motor unit of claim 4, further characterized in that the circuit links are formed by stamping from a single sheet of conductive material.

6. The electrical motor unit of claim 2, further characterized in that the first contacts are configured for a pluggable connection with the mating connector.

7. The electrical motor unit of claim 1, further characterized in that the second contacts are attached to the associated circuitry of the brush housing, such that a single unit is formed of the motor unit and the brush housing.

8. The electrical motor unit of claim 2, further characterized in that the electronic components disposed on the circuit links include electronic components in a packaged form.

9. The electrical motor unit of claim 2, further characterized in that the electronic components include a power control device.

10. The electrical motor unit of claim 9, further characterized in that the power control device is a power transistor.

11. The electrical motor unit of claim 2, further characterized in that the electronic components include a logic control device.

12. The electrical motor unit of claim 11, further characterized in that the logic control device is a CPU.

\* \* \* \* \*